Sept. 23, 1969 L. W. PRIDDY 3,469,202

LOW DEADBAND AMPLIFIER APPARATUS

Filed Oct. 23, 1967

INVENTOR.
LLOYD W. PRIDDY

BY Bruce C Lutz

ATTORNEY 3,469,202

LOW DEADBAND AMPLIFIER APPARATUS

Lloyd W. Priddy, Mahtomedi, Minn., assignor to Honeywell Inc., Minneapolis, Minn., a corporation of Delaware Filed Oct. 23, 1967, Ser. No. 677,357
Int. Cl. H03f 3/18, 1/34
U.S. Cl. 330—28 6 Claims

ABSTRACT OF THE DISCLOSURE

A two stage amplifying circuit incorporating feedback wherein a complementary output amplifier utilizes a "feed forward" network to eliminate deadband effects.

Background

The invention herein described was made in the course of or under a contract or subcontract thereunder, with the Department of the Air Force.

The present invention pertains to electronic circuits and particularly to transistorized electronic amplifiers.

One of the fundamental problems faced by a designer of transistor amplifiers is the problem of providing an amplifier capable of driving a large load. A fundamental method for driving such a load involves the use of an amplifier stage using complementary transistors operating a class B configuration. The complementary amplifier stage allows the use of comparatively large supply voltages to drive the load, but an inherent difficulty of complementary amplifiers is the deadband region produced at the output of the amplifier stage when small input voltages are applied.

Prior art techniques reduce the size of the deadband by connecting a complementary amplifier in cascade with a high gain, usually low power amplifier having low deadband and providing a negative feedback path from the output of the complementary stage to the input of the high gain stage. Since the high gain and the deadband are contained within the feedback loop, the high gain amplifier will act to considerably reduce the overall deadband of the cascade connection.

Although the connection of the high gain amplifier and the complementary output stage results in a lowered overall deadband, there are some applications where even the reduced deadband is too large for effective system operation. An example of such an application is the use of such an amplifier to provide a rebalance signal for an attitude gyro to produce a rate gyro. Even a small amount of amplifier deadband in such an application will result in constant "hunting" or dithering of the resultant rate gyro output.

The present invention was developed in response to a need for an amplifier which is capable of driving a large load and which has an extremely small deadband.

Description

It is an object of this invention to provide an improved power amplifier.

It is a further object of this invention to provide an improved power amplifier with a reduced deadband.

The inventive concept of the present invention is the reduction of the deadband of the complementary amplification stage by using a "feed forward" network to bypass the complementary stage for signals which would otherwise lie within the deadband of the complementary stage.

Further objects and advantages will be come apparent from a reading of the specification and claims in conjunction with the drawings wherein:

Figure 1:
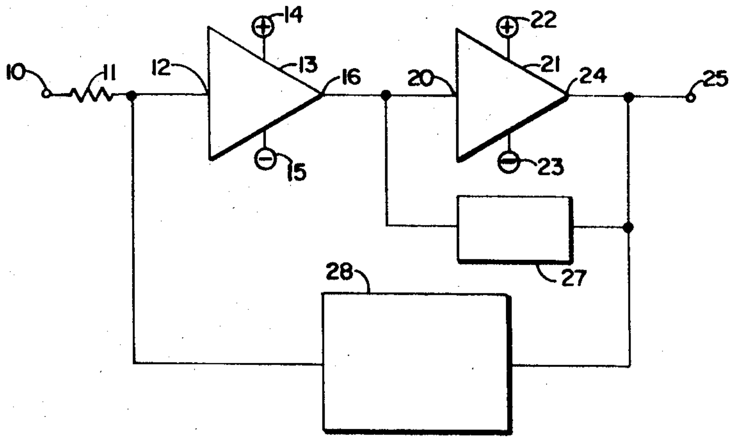
FIGURE 1 is a block diagram illustrating the inventive concept.

An input terminal 10 is connected through a resistor 11 to an input terminal 12 of a high-gain inverting operational amplifier 13. Amplifier 13 receives power from a source of positive voltage 14 and a source of negative voltage 15 and produces an output at output terminal 16. Output terminal 16 is connected to an input terminal 20 of a noninverting power amplifier stage 21. Power amplifier 21 receives power from a source of positive voltage 22 and a source of negative voltage 23. Generally, the magnitude of sources 14, 15, 22 and 23 is equal to or greater than the desired swing of the respective outputs. A high impedance output terminal 24 of amplifier 21 is connected to an output terminal 25. The input-output characteristics of amplifier 21 may be characterized as having a deadband region or region of insensitivity for small input signals.

Output terminal 24 and input terminal 20 of amplifier 21 are connected by a feed forward, or shunt network 27. Output terminal 25 is connected to input terminal 11 by a feedback means or impedance means 28.

Figure 2:
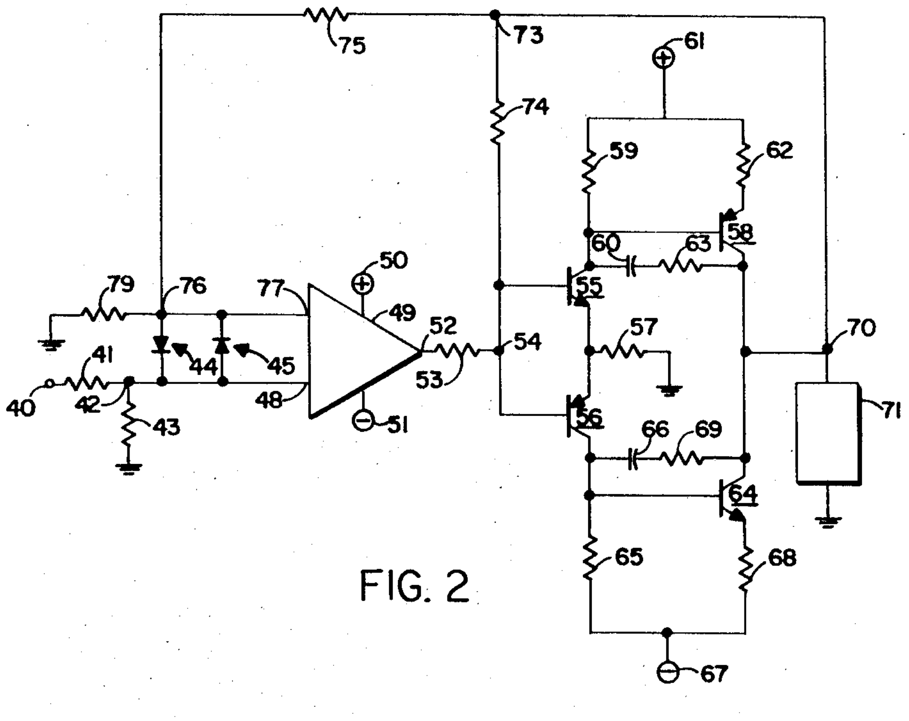
FIGURE 2 is a schematic diagram of a preferred embodiment of the present invention.

In FIGURE 2 an input terminal 40 is connected to one end of a resistor 41 the other end of which connected to a terminal 42. Terminal 42 is connected to one end of a grounded resistor 43 and to one end of a parallel reversely connected combination of two diodes 44 and 45. Terminal 42 is also connected to a noninverting input terminal 48 of a high gain operational amplifier 49 which may be assembled from discrete semi-conductor components or may be a monolithic integrated circuit such as the $\mu$a. 709 manufactured by Fairchild Camera and Instrument Corp., 13 Fairchild Drive, Mountain View, Calif. Amplifier 49 is powered by a source of positive voltage 50 and a source of negative voltage 51. An output terminal 52 of amplifier 49 is connected through an impedance 53 to a terminal 54. The impedance of the output of amplifier 49 and the resistance of the resistance means 53 is in the preferred embodiment, a relatively low impedance totalling approximately 100 ohms. Terminal 54 is connected to a base of an NPN transistor 55 and a base of a PNP transistor 56. The emitters of transistors 55 and 56 are connected to one end of a grounded resistor 57. A collector of transistor 55 is connected to a base of a PNP transistor 58 and also to one end of a resistor 59 the other end of which is connected to a source of positive voltage 61. An emitter of transistor 58 is connected to the source of positive voltage 61 through a resistor 62. A collector of PNP transistor 56 is connected to a base of an NPN transistor 64 and also to one end of a resistor 65, the other end of which is connected to a source of negative voltage 67. An emitter of transistor 64 is connected to one end of a resistor 68 the other end of which is connected to negative voltage source 67. A collector of PNP transistor 58 and a collector of NPN transistor 64 are each connected to an output terminal 70. The collector of transistor 55 is connected to terminal 70 through a series connection of a resistor 60 and a capacitor 63. The collector of transistor 56 is connected to terminal 70 by a series connection of a capacitor 66 and a resistor 69. Output terminal 70 is connected to an electrical load 71. Output terminal 70 is also connected to a terminal 73. A resistance means, or impedance means or feed forward means 74 is connected between terminal 73 and terminal 54. A resistor or impedance means 75 is connected between terminals 73 and 76. Terminal 76 is connected to a noninverting input 77 of amplifier 49 and also to the other end of the reversely connected parallel combination of diodes 44 and 45. A resistor 79 is connected between terminal 76 and ground.

Operation

If, in FIGURE 1, a positive input signal is applied to terminal 10, the output signal at terminal 16 is a negative voltage due to the inverting action of amplifier 13. The negative voltage at the output terminal 16 of amplifier 13 is applied to input terminal 20 of amplifier 21 and to the feed forward network 27. If the negative voltage at terminal 16 is large enough amplifier 20 will not operate in the dead zone and a negative voltage will be produced at output terminal 24 of amplifier 21. The negative voltage is passed to the output terminal 25 and conducted through feedback means 28 to input terminal 11. Thus, the combination of the two amplifiers is stabilized by degenerative feedback through impedance means 28.

If the signal appearing at terminal 16 is large enough to drive amplifier 21 out of the deadband region, the signal path through network 27 has only a minor effect on the output signal appearing at terminal 25. The gain of amplifier 21 is greater than the gain of network 27 for large input signals. Since the amplifier 21 is a noninverting amplifier, there is small amount of positive feedback introduced by network 27. The amount of feedback is quite small because of a voltage divider formed by high impedance output of amplifier 21 and the low impedance at the input of amplifier 21. The magnitude of the impedance of network 27 is selected such that the overall gain of the positive feedback is less than the forward gain of the amplifier, thus assuring stability of the overall amplifier.

When the input signal at terminal 10 is of a small amplitude the output signal at terminal 16 is too small to drive amplifier 21 out of the deadband region and amplifier 21 is thus approximated by an open circuit for small input signals. A path is provided, however, from output terminal 16 of amplifier 13 to terminal 25 through impedance means 27. Thus, the overall amplification from input terminal 11 to output terminal 25 is provided through the cascade connection of amplifiers 13 and 21 for large signals and through the cascade connection of amplifier 13 and impedance means 27 for very small input signals. Thus, the resulting amplifier is able to drive high power signals through power stage 21 but is forced to assume a stable null because of the path formed around the power stage 21 by the impedance means 27.

It is not necessary that networks 27 and 28 be individual networks. A voltage divider or a tapped resistor may be used to connect terminal 26 and terminal 12 with the tap connected to terminal 25.

In the preferred embodiment of FIGURE 2 a positive signal is applied to noninverting input terminal 40 which causes a negative voltage to be produced at output terminal 52 of amplifier 49. If the negative voltage at output terminal 52 of amplifier 49 is sufficiently large, the base emitter junction of transistor 56 will be biased ON and the voltage at the collector of transistor 56 will increase. The increase of the voltage at the collector of transistor 56 forward biases transistor 64 and the voltage at the collector of transistor 64 becomes more negative. The negative voltage at the collector of transistor 64 is connected to the load 71 and is also connected through feedback means 75 to terminal 76. Terminal 76 is connected to the inverting input of amplifier 49. Thus, degenerative feedback is provided to stabilize the cascade combination of the amplifier 49 and the power amplifier comprised of transistors 55, 56, 58 and 64. Diodes 44 and 45 are used to provide protection for amplifier 49 if unusually large input signals are applied at input terminal 40. The path from terminal 73 through resistor 74 to terminal 54 has little effect when the signal at output terminal 52 of amplifier 49 is sufficiently large to forward bias either transistor 55 or transistor 56. The path formed through resistor 74 has little effect because the source impedance seen at terminal 70 is very high, approximating that of a current source, while the impedance at terminal 54 is essentially the combination of the resistance 53 and the output impedance of amplifier 49 seen at output terminal 52. Thus, very little signal will be conducted from the output 70 to terminal 54. The loop gain of the amplifier and the positive feedback resistor 74 is less than unity, so that stable operation will result. Negative feedback through capacitor 60 and resistor 63 and through capacitor 66 and resistor 69 provides high frequency stabilization.

If, however, the input signal applied to terminal 40 is small enough that the signal at output terminal 52 is insufficient to forward bias either transistor 55 or 56, the signal will be passed through resistor 74 to output terminal 70. The overall gain of the circuit is determined approximately by the ratio of feedback resistor 75 to input resistor 41 and is largely independent of whether the power stage is used to drive output terminal 70 or whether the signal is shunted around the power stage by resistor 74. In the preferred embodiment the ratio of the resistance of 74 to the resistance of 75 is approximately 1 to 8.

The preferred embodiment is thus able through the use of the power stage to drive a load such as 71 from fairly high voltage supplied such as 61 and 67. The feed forward path, by allowing the signal from the high gain amplifier 49 to be shunted around the power stage for input signal levels where the power stage is ineffective, provides a substantial decrease in instability introduced by the deadband of the power stage. For larger input signals the power stage operates normally and the shunt resistor 74 is ineffective.

Alterations and variations will be obvious to those skilled in the art.

I claim:

1. In a low deadband amplifier having input means and output means;

inverting amplifier means including input means and output means, the output means of said first amplifying means characterized by a low impedance;

non-inverting amplifier means including input means and output means, the output means of said second amplifying means characterized by an impedance much larger than the impedance of the low inpedance output means of said first amplifying means, the input means of said non-inverting amplifying means connected to the output means of said inverting amplifier means;

means connecting the output means of said inverting amplifier means to the output means of said non-inverting amplifier means; and degenerative feedback means connecting the output means of said non-inverting amplifier means to the input means of said inverting amplifier means.

2. Apparatus of the class described in claim 1 wherein said second amplifying means is a power amplifier with a complementary output stage.

3. Apparatus of the class described in claim 2 wherein the means connecting the output means of said first amplifying means to the output means of said second amplifying means comprises an impedance means.

4. Apparatus of the class described in claim 3 wherein the impedance means is a resistor.

5. Apparatus of the class described, comprising:

inverting amplifier means, including input means and output means, the output means of said inverting amplifier means having a low source impedance;

non-inverting amplifier means including input means and output means, the input means of said non-inverting amplifier being connected to the output means of said inverting amplifier means and the output means of said non-inverting amplifier means having a high source impedance relative to the source impedance of the output means of said inverting amplifier means;

first impedance means connected from the input means of said non-inverting amplifier means to the output means of said non-inverting amplifier means; and second impedance means connected from the output means of said non-inverting amplifier means to the input means of said inverting amplifier means.

6. Apparatus of the class described comprising:

inverting amplifier means, including input means and output means, the output means of said inverting amplifier means having a low source impedance;

non-inverting amplifier means including input means and output means, the non-inverting amplifier means characterized as producing a signal at the output means which is insensitive to small signals supplied to the input means and the output means of said non-inverting amplifier means chracterized by a source impedance substantially greater than the source impedance of the output means of said inverting amplifier means;

means connecting the output means of said inverting amplifier means to the input means of said non-inverting amplifier means; and voltage divider feedback means including first and second terminals and a third terminal connected intermediate to the first and second terminals to produce an output voltage at the third terminal of which is a substantially constant fraction of the voltage applied between the first and second terminals, the first terminal of said voltage divider means connected to the input means of said non-inverting amplifier means, the second terminal of said voltage divider means connected to the input means of said inverting amplifier means, the third terminal of said voltage divider means connected to the output means of said non-inverting amplifier means.

References Cited

UNITED STATES PATENTS

| | | | |
|---|---|---|---|
| 2,231,542 | 2/1941 | Mallinckrodt | 330—104 X |
| 3,188,574 | 6/1965 | Parmer | 330—15 X |
| 3,312,833 | 4/1967 | Durrett | 307—88.5 |

ROY LAKE, Primary Examiner

J. B. MULLINS, Assistant Examiner

U.S. Cl. X.R.

330—17, 100, 104, 151